United States Patent [19]
Igarashi

[11] Patent Number: 5,421,896
[45] Date of Patent: Jun. 6, 1995

[54] GRAPHITE HEATER FOR MOLECULAR BEAM SOURCE OF CARBON

[75] Inventor: Takeshi Igarashi, Yamanashi, Japan

[73] Assignee: Fujitsu Limited, Kawasaki, Japan

[21] Appl. No.: 312,193

[22] Filed: Sep. 26, 1994

[30] Foreign Application Priority Data

Jan. 13, 1994 [JP] Japan .................................. 6-002141

[51] Int. Cl.$^6$ ....................... C23C 14/00; C23C 14/26
[52] U.S. Cl. .................... 118/726; 392/386; 219/538; 219/539; 428/367
[58] Field of Search ..................... 392/386; 428/367; 118/726; 219/538, 539

[56] References Cited

U.S. PATENT DOCUMENTS

| | | | |
|---|---|---|---|
| 3,738,906 | 6/1973 | Olcott | 428/367 |
| 4,435,375 | 3/1984 | Tamura | 423/439 |
| 4,565,649 | 1/1986 | Vogel | 423/460 |

OTHER PUBLICATIONS

"Carbon Doping of GaAs for Heterojunction Bipolar Transistors: A Comparison Between MBE and CBE", Benchimol et al, Journal of Crystal Growth, vol. 127, 1993, pp. 690–694.

"Carbon Doping in Molecular Beam Epitaxy of GaAs from a Heated Graphite Filament", Malik et al, Appl. Phys. Lett., vol. 53, No. 26, Dec. 26, 1988, pp. 2661–2663.

"Carbon Doping of MBE GaAs and $Ga_{0.7}Al_{0.3}As$ Films Using a Graphite Filament", Hoke et al, Journal of Crystal Growth, vol. 111, 1991, pp. 269–273.

"Molecular—Beam Epitaxial Growth of Heavily Acceptor Doped GaAs Layers for GaAlAs/GaAs Heterojunction Bipolar Transistors", Hoke et al, J. Vac. Sci. Technol. B., vol. 10, No. 2, Mar./Apr. 1992, pp. 856–858.

"Carbon Incorporation in (AlGa)As, (AlIn)As and (GaIn)As Ternary Alloys Grown by Molecular Beam Epitaxy", Ito et al, Japanese Journal of Applied Physics, vol. 30, No. 6A, Jun. 1991, pp. 944–947.

"Properties and Applications of Carbon-Doped GaAs and $Al_xGa_{1-x}As$ Layers Grown by MBE with a Pyrolytic Graphite Filament", Malik et al, Journal of Crystal Growth, vol. 127, 1993, pp. 686–689.

*Primary Examiner*—Richard Bueker
*Attorney, Agent, or Firm*—Nikaido, Marmelstein, Murray & Oram

[57] ABSTRACT

A graphite filament for generating carbon molecular beam which is heated through application of a current thereto integrally comprises a plurality of portions of which current directions match the c-axis of the graphite and a plurality of portions of which current directions are perpendicular to the c-axis.

16 Claims, 6 Drawing Sheets

| | CELL-SUBSTRATE (cm) | RESISTIVITY (Ωmm) | RESISTANCE (Ω) | CURRENT (A) | POWER (W/cm²) | STABILITY (% h⁻¹) |
|---|---|---|---|---|---|---|
| FIRST EMBODIMENT | 60 | 2 (// C-AXIS) | 2.5 | 30 | 300 | 0.3 |
| SECOND EMBODIMENT | 60 | 2 (// C-AXIS) | 2.7 | 30 | 300 | 0.2 |
| SINTERED GRAPHITE | 20 | $10^{-2}$ | 0.25 | 35 | 300 | — |
| PYROLITIC GRAPHITE | 20 | $4 \times 10^{-3}$ (⊥ C-AXIS) | 0.1 | 55 | 300 | — |
| PYROLITIC GRAPHITE | 60 | $4 \times 10^{-3}$ (⊥ C-AXIS) | 0.01 | 173 | 300 | — |

GRAPHITE HEATER FOR MOLECULAR BEAM SOURCE OF CARBON

BACKGROUND OF THE INVENTION

1. Field of the Invention

The present invention relates to a structure of a carbon molecular beam source provided in a molecular beam epitaxial growth apparatus and particularly to a structure of graphite filament which operates as a carbon molecular beam source.

As a p-type dopant for III-V compound semiconductor, beryllium (Be) has been generally used. However, in these years, a p-type base of a heterojunction bipolar transistor (HBT) which has been produced by the molecular beam epitaxy (MBE) method as a high speed device provides a problem that a concentration profile is disturbed remarkably in the base layer due to diffusion of Be because a base layer is thin and concentration of Be is high. Therefore, carbon (C) which is more difficult to result in diffusion than Be is attracting more attention as the p-type dopant.

Carbon vapor is usually generated by heating graphite resistively with a current. In this case, it is extensively required that an amplitude of the heating current is in the practical range and carbon beam intensity is stabilized from the point of view of manufacturing a device.

2. Description of the Related Art

Figure 1:
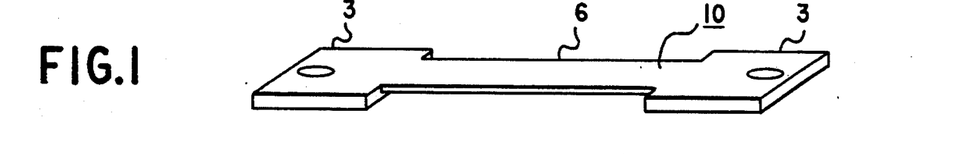
FIG. 1 is a perspective view illustrating a graphite filament of the prior art.

In order to generate carbon beam in a molecular beam epitaxial growth method, carbon vapor is usually generated by resistively heating of a graphite filament provided in a doping cell of a molecular beam epitaxial growth apparatus (hereinafter, called a MBE growth apparatus). FIG. 1 is a perspective view of a conventional graphite filament which operates as a carbon molecular beam source.

As shown in FIG. 1, a filament 10 comprises a heating portion 6 and current terminals 3 provided at both ends thereof. A material used is a sintered graphite or pyrolytic graphite. The heating portion 6 is sized, for example, as 1 mm in thickness, 2 mm in width and 50 mm in length.

When sintered graphite is selected as the material, the filament 10 is cut in the direction selected freely from a block of the sintered graphite. Meanwhile, when pyrolytic graphite is selected, a generally available material is thinner in the direction of c-axis and is formed as a plate spreading in the plane perpendicular to the c-axis. Therefore, the filament 10 has a structure allowing power feeding in the plane perpendicular to the c-axis. Intensity of carbon molecular beam can be controlled by controlling a current fed to the filament 10.

However, since resistivity of sintered graphite is not anisotropic and is about $10^{-2}$ ohm·mm, while resistivity of pyrolytic graphite in the direction perpendicular to the c-axis is about $4 \times 10^{-3}$ ohm·mm, a heating current of the filament 10 has a considerably large value. This is a first problem. That is, graphite must be set to a temperature of about 2000° C. in order to generate carbon molecular beam by heating graphite with a current. For this purpose, the filament consumes the power of about 300 W/cm². In the case of sintered graphite, when the heating portion 6 of the filament 10 is sized as 1 mm in thickness, 2 mm in width and 50 mm in length (current direction), the filament 10 shows resistance of 0.25 Ω and current of 35 A. On the other hand, when the same filament 10 is formed of pyrolytic graphite, a current is fed in the direction perpendicular to the c-axis, resistance becomes 0.1 Ω and current is about 55 A. The filament 10 explained above is used for a carbon molecular beam source cell of a small size MBE growth apparatus which the distance between the growth substrate and the carbon molecular beam source cell is about 20 cm. If this filament 10 is used for carbon molecular beam source of a large size MBE growth apparatus resulting in the distance of about 60 cm, the carbon molecular beam intensity which is about one order of magnitude larger than that used for the small size apparatus is required. In this case, consumption of the filament 10 due to evaporation of carbon also becomes about ten times larger and therefore thickness of the filament must be ten times thicker than that for a small size MBE growth apparatus if the filament area is constant. When the heating portion 6 is formed of the pyrolytic graphite sized as 10 mm in thickness, 2 mm in width and 50 mm in length, a current becomes 173 A and this value is practically too large.

Of course, it is possible to provide a filament having the area increased by 10 times, but power consumption is also increased up to 10 times in this case. From this point of view, it is not a practical method.

The second problem of a conventional graphite filament is that if filament resistance changes, intensity of carbon molecular beam also changes because intensity of carbon molecular beam is controlled by a filament current. That is, a resistance value of the filament 10 changes with evaporation of carbon. Accordingly, if a current is controlled to a constant value, power consumption of the filament 10 changes and temperature of the filament 10 also changes. As a result, intensity of carbon molecular beam changes. For instance, under the ordinary application condition, the filament 10 mentioned above (the heating portion 6 has the sizes of 1 mm in thickness, 2 mm in width and 50 mm in length) shows reduction of thickness at a rate of about 1 μm/h. Therefore, resistance increases at a rate of about 0.1%/h, while power consumption also increases. Temperature of the filament rises to 2000.57° C. from 2000° C., while carbon vapor pressure is almost proportional to $10^{-40000/T}$ (T is the absolute temperature of the filament). Thereby, intensity of carbon molecular beam increases at a rate of about 1%/h.

SUMMARY OF THE INVENTION

It is an object of the present invention to provide a kind of graphite filament for carbon molecular beam having a high resistance value which enables heating with a sufficiently practical current value.

It is another object of the present invention to provide a kind of graphite filament which stably supplies carbon molecular beam even if a resistance value of graphite filament changes due to evaporation.

The objects mentioned above are all achieved by carbon molecular beam source having a heating portion which permits power feeding in the direction of c-axis of graphite.

Figure 2A:
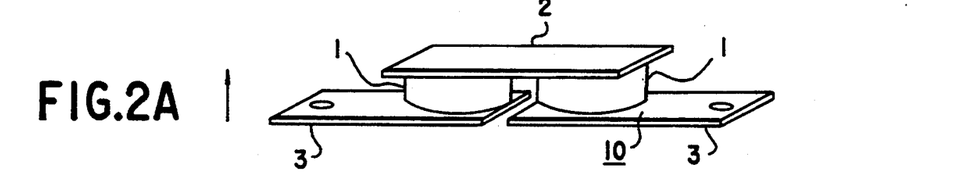
FIGS. 2A–2D are diagrams for explaining the principle of the present invention.

FIGS. 2A, 2B, 2C, 2D are diagrams for explaining the principle of the present invention. As shown in FIG. 2A, the graphite filament 10 of the present invention has the heating portion 1 in which a current flows in the direction of c-axis of graphite and a wiring portion 2 in which a current flows in the direction perpendicular to the c-axis of graphite. The current enters one heating portion 1 from one current terminal 3, then enters the other heating portion 1 through a wiring portion 2 connected to the heating portion 1 and then goes out of the other current terminal 3 connected to the other heating portion 1. A resistivity of pyrolytic graphite in the direction perpendicular to the c-axis is about $4 \times 10^{-3} \Omega \cdot mm$ but resistivity in the direction of the c-axis is about $2\Omega \cdot mm$. Therefore, a resistance of the filament 10 as a whole can be set to several $\Omega$. In the case of the graphite filament 10 of the present invention, carbon e evaporates from both heating portion 1 and wiring portion 2. However, since resistance of the wiring portion 2 is small in comparison with that of the filament 10 as a whole, consumption of the wiring portion 2 due to evaporation gives only a small influence on resistance of the filament 10. Accordingly, change of carbon molecular beam intensity can be reduced by increasing a rate of carbon molecular beam emitted from the wiring portion 2.

Figure 2B:
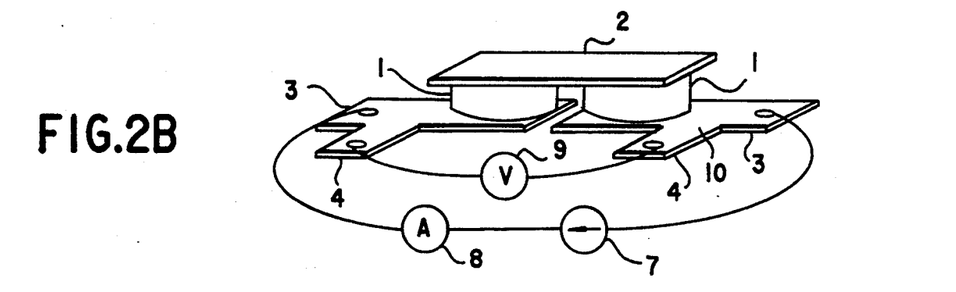

For accurate control of carbon molecular beam intensity, it is effective to measure and control power consumption of filament with high precision. In view of enhancing measuring accuracy of power consumption of the filament, a branch terminal 4 is respectively provided to a couple of current terminals 3 as shown in FIG. 2B and a voltmeter 9 is connected to the branch terminal for measuring a voltage thereof. Thereby, an accurate filament voltage can be measured by eliminating influence of contact resistance and wiring resistance. The power supply 7 is controlled so that power consumption of the filament becomes constant, by observing indication of an ammeter connected in series to the power supply 7 connected to the current terminal 3 and indication of a voltmeter 9. Carbon molecular beam intensity can be accurately controlled with such a method.

Figure 2C:
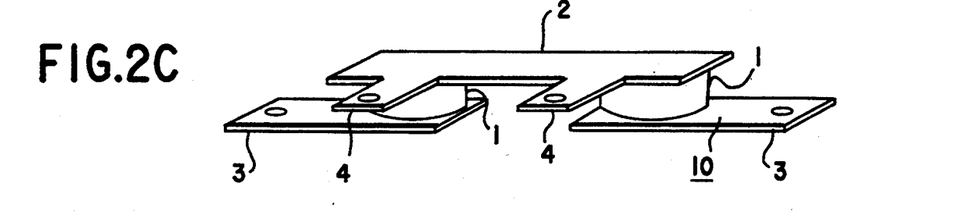
Figure 2D:
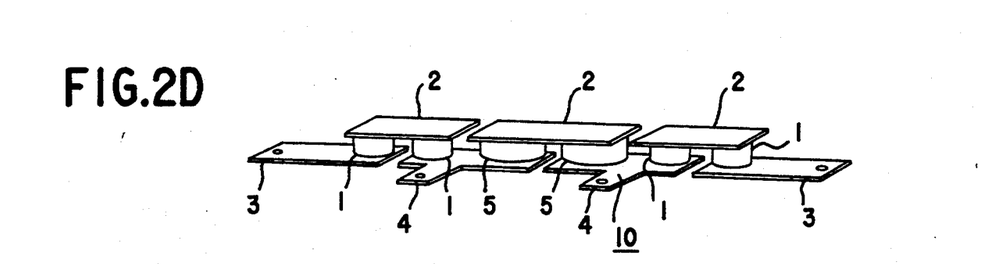

Moreover, as another method for accurately controlling carbon molecular beam intensity, it is an effective method to accurately measure the temperature of filament and then control the power supply 7 with such temperature. An area where is comparatively low in temperature and is a little changed in the shape due to evaporation is formed in anywhere on the filament. A resistance value of this area can be thought as depending only on temperature since there is no change of resistance value due to the change of shape. Therefore, temperature of the filament can be detected from dependence of resistivity on temperature by measuring a resistance value. As shown in FIG. 2C, a resistance measuring portion may be selected only to the wiring portion 2. However, it is also possible to include the heating portion 5 as shown in FIG. 2D in order to increase measuring accuracy by increasing a resistance value. The filament shown in FIG. 2D has the constitution combining FIG. 2A and FIG. 2B. When the resistance measuring portion includes the heating portion 5, a resistance value is set smaller than that of the other heating portion 1 in order to make small the change due to evaporation.

As described, using a graphite filament of the present invention for the MBE growth as a carbon molecular beam source, a large intensity carbon molecular beam can be generated by feeding a current having the sufficiently practical amplitude as high as about 30 A. Moreover, fluctuation of carbon molecular beam intensity is 0.3% or less per hour and this value is about ⅓ that in the prior art where a current is controlled to the constant value.

DESCRIPTION OF THE PREFERRED EMBODIMENTS

Two embodiments of the present invention will then be explained by referring to the accompanying drawings. The like elements and the materials are designated by the like reference numerals throughout the drawings.

First Embodiment

Figure 3A:
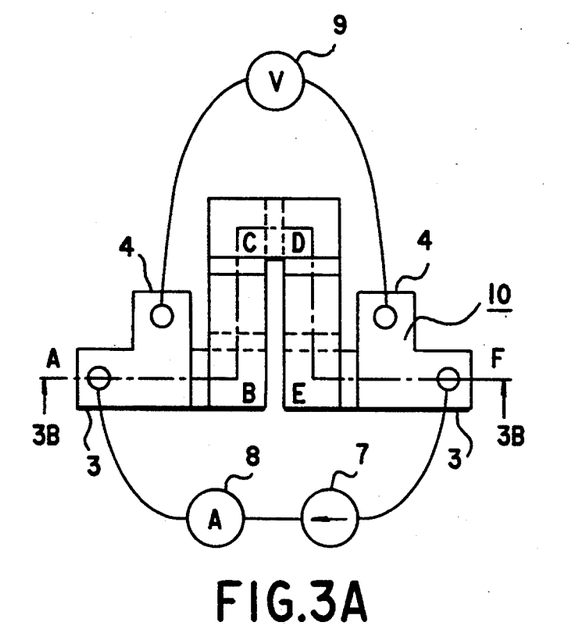
FIG. 3A is a plan view of a pyrolytic graphite filament of the type providing branch terminals respectively to a couple of current terminals.
Figure 3B:
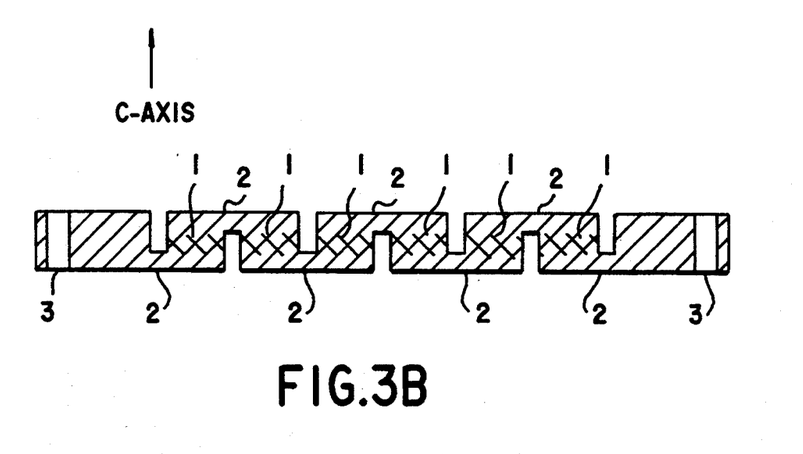
FIG. 3B is an A-B-C-D-E-F schematic sectional view of the pyrolytic graphite filament of FIG. 3A.

This embodiment is basically a pyrolytic graphite filament of the type respectively providing branch terminals 4 to a couple of current terminals as shown in FIG. 2B. A plan view of this filament is schematically shown in FIG. 3A. As shown in FIG. 3A, the current terminal 3 is connected in series with a power supply 7 and an ammeter 8. The branch terminal 4 is connected with a voltmeter 9. FIG. 3B shows an A-B-C-D-E-F sectional view of the graphite filament of FIG. 3A. As illustrated in the figure, this graphite filament integrally comprises six heating portions 1 and seven wiring portions 2 connecting the heating portions 1. Practically, these portions of a graphite filament are formed by making the predetermined grooves on the obverse and reverse face of a graphite plate, of which direction coincides with the c-axis of the graphite plate. The heating portion 1 is shaped as a rectangular column extending in the direction matched with the c-axis of the pyrolytic graphite. The heating portion 1 is connected with the wiring portions 2 at a couple of end faces perpendicular to the c-axis. The end face has the dimension of 6 mm $\times$ 6 mm and the length thereof in the direction of the c-axis is about 3 mm. The pyrolytic graphite used are all made by Union Carbide Corp.

The power supply 7 is controlled so that the power is kept constant by consulting with indication of the ammeter 8 and voltmeter 9. As an example of the control system, following system is used. That is, outputs of the ammeter 8 and voltmeter 9 are input to a multiplier (not illustrated) for computing the power and then an output of the multiplier is input to PID (proportional plus integral plus derivative) controller (not illustrated). An output of the PID controller is used as a control input of the power supply 7.

Figure 6:
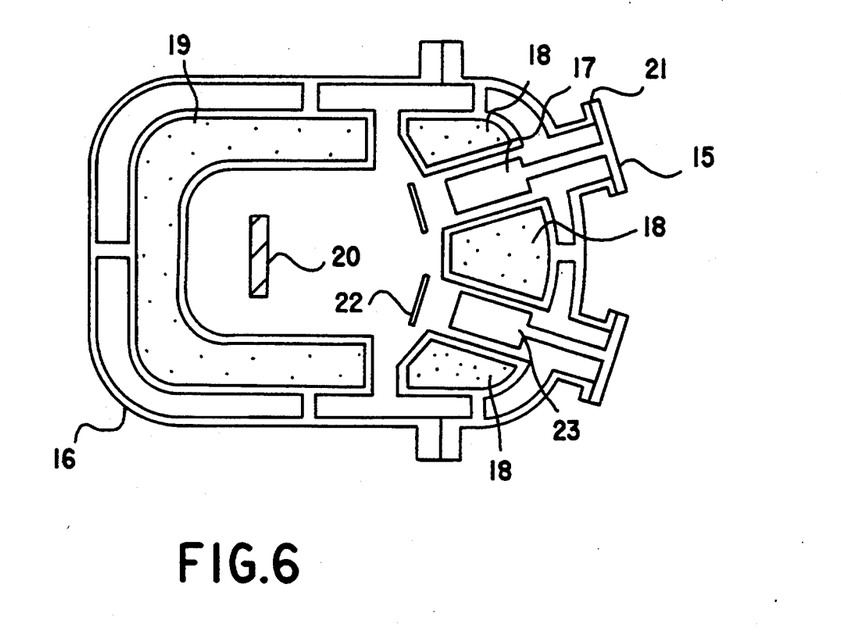
FIG. 6 is a schematic diagram of a large size MBE growth apparatus loading a graphite filament of the present invention.

A graphite filament similar to that shown in FIG. 3A, however, connecting in series 15 heating portions 1 has been used in a large size MBE growth apparatus keeping the distance between the carbon molecular beam source cell and the growth substrate as long as about 60 cm. This large size MBE growth apparatus loading such graphite filament is schematically shown in FIG. 6. FIG. 6 schematically illustrates a structure of the cross-section of the growth chamber 16 of the MBE growth apparatus. In the growth chamber 16, the molecular beam source cell 23 for MBE growth (generally composed of a plurality of cells, but represented here by only one cell), the carbon molecular beam source cell 17 of the present invention and the growth substrate 20 are arranged via the molecular beam source cell shutter 22. Moreover, in the growth chamber 16, a growth chamber shroud 19 for maintaining high vacuum condition of the growth chamber and a molecular beam source cell shroud 18 for preventing mutual thermal interference of molecular beam source cell are provided.

The carbon molecular beam source cell 17 comprises therein the graphite filament is fixed to a flange 21 of the growth chamber 16 with a flange 15.

Figure 7A:
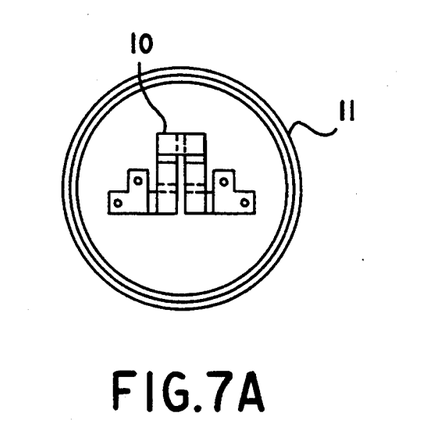
FIG. 7A is a schematic plan view of a graphite filament loaded in a carbon molecular beam source cell.
Figure 7B:
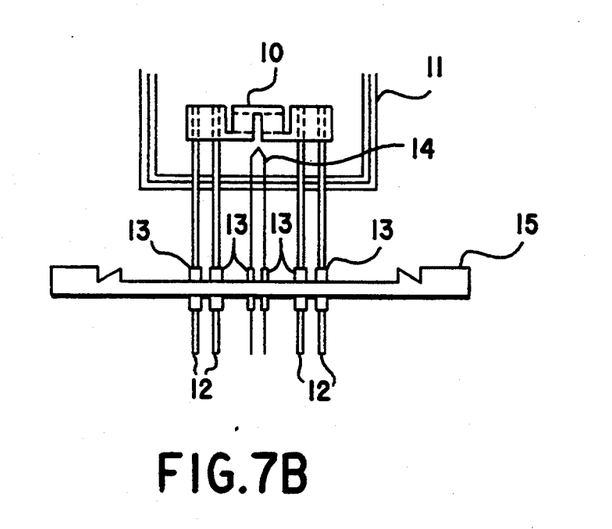
FIG. 7B is a schematic front elevation of a graphite filament loaded in a carbon molecular beam source cell.

FIG. 7A and FIG. 7B schematically illustrate the graphite filament 10 loaded in the carbon molecular beam source cell 17. As shown in FIG. 7A, FIG. 7B, the graphite filament 10 is arranged at the inside of a cylindrical reflector 11 and leads 12 from the current terminal 3 and branch terminal 4 of the graphite filament 10 are respectively guided from a vacuum flange 15 through electric feedthroughs 13. A thermocouple 14 for roughly monitoring temperature of the graphite filament 10 is provided in the vicinity of the filament 10 and the leads thereof are also guided from the vacuum flange 15, which is coupled with a flange 21 shown in FIG. 6.

Figure 8:
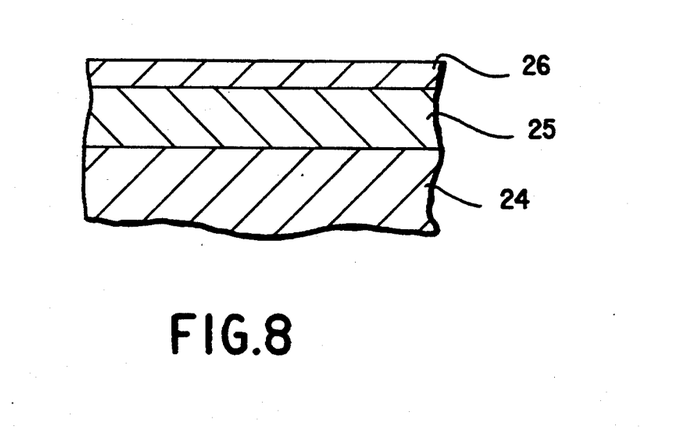
FIG. 8 is a diagram illustrating a GaAs molecular beam epitaxial layer obtained by conducting carbon doping using the graphite filament of the present invention.

Carbon has been experimentally doped with the carbon molecular beam during actual epitaxial growth of gallium arsenide (GaAs) using MBE growth apparatus shown in FIG. 6. As shown in FIG. 8, an undoped GaAs epitaxial layer 25 has been grown in the thickness of 500 nm on a semi-insulating GaAs substrate 24, and a carboll doped GaAs epitaxial layer 26 has successively been grown thereon in the thickness of 200 nm. In this case, a current of graphite filament 10 is about 30 A and carbon molecular beam intensity has been $5 \times 10^{19} m^{-2} h^{-1}$ on the substrate. That is, carbon concentration in the GaAs epitaxial layer 26 is $5 \times 10^{19} cm^{-3}$ when the growth rate of the epitaxial is 1 $\mu m\ h^{-1}$. In addition, fluctuation of the carbon molecular beam intensity has been 0.3%/h or less which is about ⅓ that when a current is controlled to a constant value.

Though a carbon doped GaAs MBE layer is explained as an example in this embodiment, carbon doped MBE layer of another III-V compound semiconductor can be obtained by using the present carbon molecular beam source.

Second Embodiment

Figure 4A:
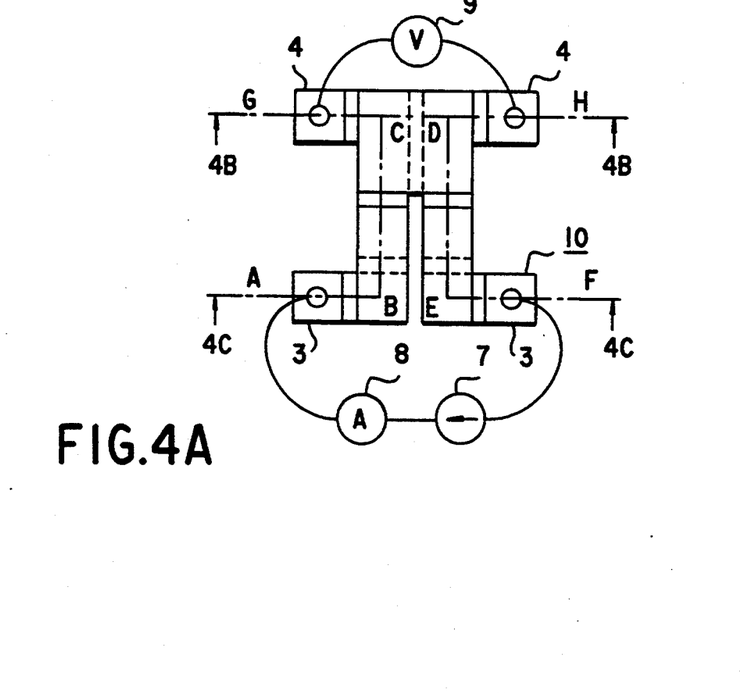
FIG. 4A is a plan view of a pyrolytic graphite filament of the type providing two kinds of heating portions having different resistance values.
Figure 4B:
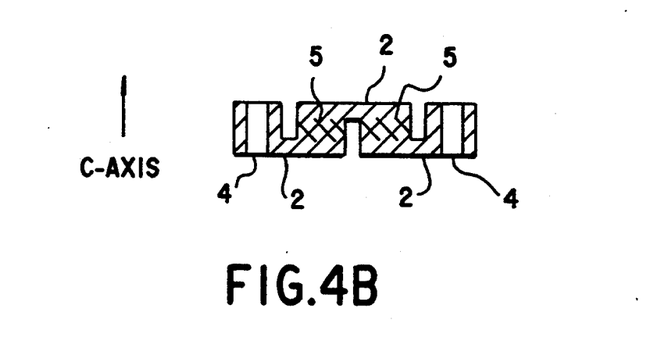
FIG. 4B is a G-C-D-H schematic sectional view of FIG. 4A.

This embodiment is basically a pyrolytic graphite filament of the type providing two kinds of heating portions having different resistance values as shown in FIG. 2D. A plan view of this embodiment is schematically shown in FIG. 4A. A G-C-D-H sectional view of FIG. 4A is schematically shown in FIG. 4B. Moreover, an A-B-C-D-E-F sectional view of FIG. 4A is schematically shown in FIG. 4C.

Figure 4C:
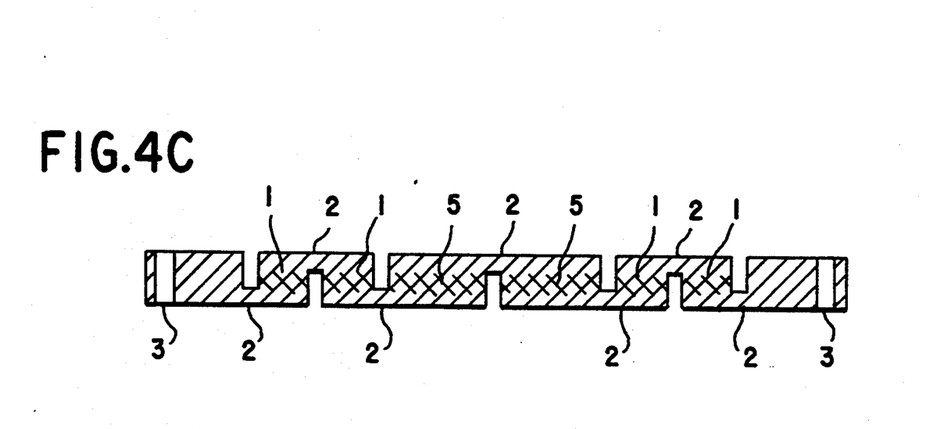
FIG. 4C is an A-B-C-D-E-F schematic sectional view of FIG. 4A.

As shown in FIG. 4C, the graphite filament of this embodiment integrally includes two heating portions 5 having small resistance value and tour heating portions 1 having large resistance value. Two heating portions 5 are arranged at the center, while two heating portions 1 are respectively arranged at the one end portion of the filament, that is, four heating portions 1 in total at both ends thereof. As shown in FIG. 4A, the current terminal 3 is connected in series with the power source 7 and ammeter 8. The wiring portion 2 connected with the heating portion 5 is provided with a branch terminal 4 which is connected with a voltmeter 9.

The heating portion 5 and heating portion 1 are both formed in the rectangular column shape of which column direction is matched with the c-axis of the pyrolytic graphite filament. The heating portions 5 and 1 have the end faces in size of 12 mm×6 mm and 6 mm×6 mm, respectively, and length in the c-axis direction of about 3 mm. The end faces of the heating portions 5 and 1 are connected with the wiring portion 2.

The power supply 7 is controlled so that a resistance value obtained from indications of ammeter 8 and voltmeter 9 is kept constant. As an example, following control system is used. Namely, outputs of the voltmeter and ammeter are input to a divider (not illustrated) to compute an reciprocal number of a resistance value and an output of the divider is then input to a PID controller (not illustrated). An output of the PID controller is used as a control input of the power supply.

A graphite filament, similar to that shown in FIG. 4A, however, connecting 15 heating portions 1 and two heating portions 5 in series, has been used for the MBE growth apparatus of FIG. 6. Like the first embodiment, epitaxial growth of gallium arsenide (GaAs) is actually attempted using the MBE growth apparatus of FIG. 6. In this case, a current of graphite filament 10 is about 30 A and intensity of carbon molecular beam on the substrate is $5 \times 10^{19} m^{-2} h^{-1}$. Moreover, fluctuation of carbon molecular beam intensity is 0.2%/h or less.

Figure 5:
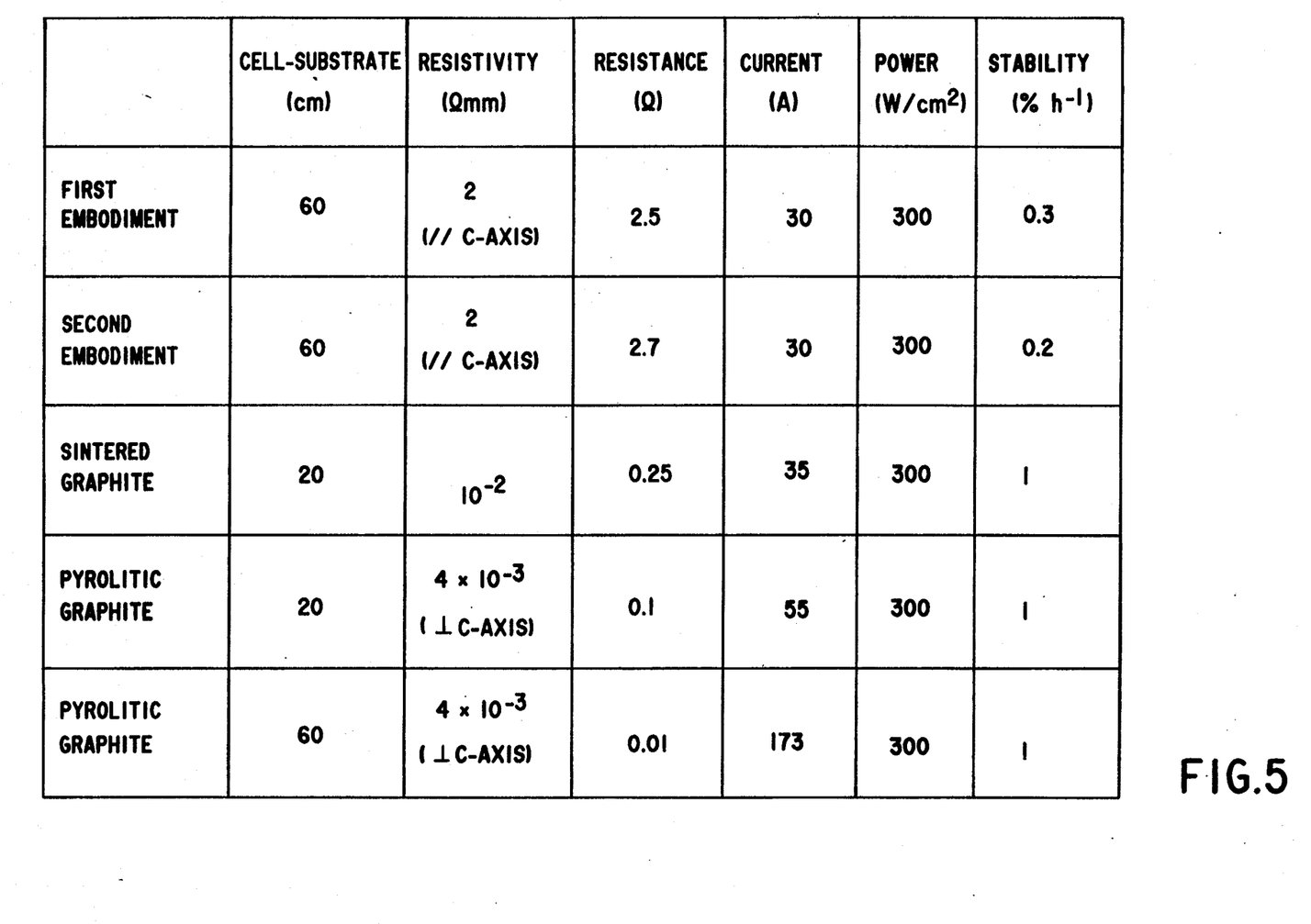
FIG. 5 is a table showing data when a graphite filament in the first and second embodiments is applied to an MBE growth apparatus.

Data applied when the graphite filaments of the first and second embodiments are used in the MBE growth apparatus are shown in FIG. 5. In this case, a doping rate of about $5 \times 10^{19} m^{-2} h^{-1}$ is assumed. For comparison, data applied to the prior art are also indicated in the same figure.

What is claimed is:

1. A graphite filament for generating carbon molecular beam by supplying a current to the graphite filament, said graphite filament comprising:
   a first portion of the graphite filament, in which the current flows along the c-axis direction of the graphite.

2. A graphite filament according to claim 1, said graphite filament further comprising:
   a pair of current terminals, respectively provided at both ends of the first portion of the graphite filament; and a pair of branch terminals provided at the first portion of the graphite filament, so that voltage between the both ends of the first portion of the graphite filament can be measured.

3. A graphite filament provided at a carbon molecular beam source cell for generating carbon molecular beam by supplying a current to the graphite filament in order to heat the filament, said graphite filament comprising:
   two first portions of the graphite filament facing each other across a groove, in which the current flows along the c-axis of the graphite;
   a second portions of the graphite filament connecting said two first portions of the graphite filament at the bottom of the groove, in which the current flows perpendicular to the c-axis of the graphite; and
   two second portions of the graphite filament, respectively connected with said two first portions of the graphite filament at the top of the groove.

4. A graphite filament according to claim 3, said graphite filament further comprising:
   a pair of branch terminals provided at two second portions of the graphite filament, respectively, said two second portions of the graphite filament are respectively connected with the two first portions of the graphite filament at the top of the groove; and
   a pair of current terminals provided at the end of two second portions of the graphite filament, respectively, said two second portions of the graphite filament are respectively connected with the two first portions of the graphite filament at the top of the groove.

5. A graphite filament according to claim 3, said graphite filament further comprising:
   a pair of branch terminals, respectively provided at both end of the second portions of the graphite filament, which connect the two first portions of the graphite filament at the bottom of the groove; and
   a pair of current terminals provided at the end of two second portions of the graphite filament, respectively, said two second portions of the graphite filament are respectively connected with the two first portions of the graphite filament at the top of the groove.

6. A graphite filament according to claims 4 or 5 wherein power consumption between branch terminals is controlled to a constant value on the basis of indications of a voltmeter connected with the branch terminal and an ammeter connected with the current terminal.

7. A graphite filament provided at a carbon molecular beam source cell for generating carbon molecular beam by supplying a current to the graphite filament in order to heat the filament, said graphite filament comprising:
   two first portions of the graphite filament facing each other across a groove, in which the current flows along the c-axis of the graphite;
   two second portions of the graphite filament facing each other across a groove, in which the current flows along the c-axis of the graphite, said second portions of the graphite filament have resistance value smaller than that of said first portions of the graphite filament; and
   a third portion of the graphite filament connecting said two first portions of the graphite filament at the bottom of the groove, in which the current flows perpendicular to the c-axis of the graphite;
   a fourth portion of the graphite filament connecting said two second portions of the graphite filament at the bottom of the groove, in which the current flows perpendicular to the c-axis of the graphite;
   a fifth portion of the graphite filament connecting said one first and one second portion of the graphite filament at a bottom of the groove, in which the current flows perpendicular to the c-axis of the graphite;
   a sixth portions of the graphite filament being connected with the one of said first and second portion of the graphite filament at the top of the groove, in which the current flows perpendicular to the c-axis of the graphite.

8. A graphite filament according to claim 7, said graphite filament further comprising:
   a pair of branch terminals provided at the fifth portions of the graphite filament connected respectively to two second portions of the graphite filament; and
   a pair of current terminals, respectively provided at the sixth portions of the graphite filament.

9. A graphite filament according to claim 8, wherein a resistance value between the branch terminals are controlled to a constant value on the basis of indications of a voltmeter connected with the branch terminals and an ammeter connected to the current terminals.

10. A molecular beam epitaxial growth apparatus provided with a carbon molecular beam source cell which can generate carbon molecular beam to dope carbon by applying a current to a graphite filament to heat itself, said molecular beam epitaxial growth apparatus comprising:
    a graphite filament having a first portion of the graphite filament in which the current flows along the c-axis of the graphite and a second portion of the graphite filament being connected with said first portion of the graphite filament, wherein the current flows perpendicular to the c-axis of the graphite; and
    a power supply control apparatus for heating the graphite filament.

11. A molecular beam epitaxial growth apparatus according to claim 10, wherein said first portion of the graphite filament is composed of a third portion of the graphite filament in which the current flows along the c-axis of the graphite and a fourth portion of the graphite filament in which the current flows along the c-axis of graphite, having a resistance value smaller than that of said third portion of the graphite filament.

12. A molecular beam epitaxial growth apparatus according to claims 10 or 11, wherein a molecular beam epitaxial layer of a carbon doped compound semiconductor is produced by using the graphite filament.

13. A molecular beam epitaxial growth apparatus according to claim 12, wherein said molecular beam epitaxial layer of carbon doped compound semiconductor is a gallium arsenide molecular beam epitaxial layer.

14. A graphite heater which generates heat by applying a current to a graphite, said graphite heater comprising:
    a first portion of the graphite heater in which the current flows along the c-axis of the graphite; and
    a second portion of graphite heater in which the current flows perpendicular to the c-axis of graphite, being connected with said first portion of the graphite heater.

15. A graphite heater according to claim 14, wherein said first portion of the graphite heater is composed of a third portion of the graphite heater in which the current flows along the c-axis of the graphite and a fourth portion in which the current flows along the c-axis of the graphite, having a resistance value smaller than that of the third portion of graphite heater.

16. A heater for generating heat by applying a current to a material having anisotropic resistivity, said heater comprising:
 a first portion of the material in which the current flows along the direction where resistivity of the material is larger than that of other direction; and
 a second portion of the material in which the current flows along the direction where resistivity is smaller than that of said first portion of the material, being connected with said first portion of the material.

* * * * *